(12) United States Patent
Coppard et al.

(10) Patent No.: US 7,687,349 B2
(45) Date of Patent: Mar. 30, 2010

(54) GROWTH OF SILICON NANODOTS HAVING A METALLIC COATING USING GASEOUS PRECURSORS

(75) Inventors: Romain Coppard, Rousset (FR); Sylvie Bodnar, Trets (FR)

(73) Assignee: Atmel Corporation, San Jose, CA (US)

( * ) Notice: Subject to any disclaimer, the term of this patent is extended or adjusted under 35 U.S.C. 154(b) by 175 days.

(21) Appl. No.: 11/554,355

(22) Filed: Oct. 30, 2006

(65) Prior Publication Data

US 2008/0099820 A1    May 1, 2008

(51) Int. Cl.
*H01L 21/336* (2006.01)
(52) U.S. Cl. .............. 438/264; 438/594; 438/962; 257/E21.681; 977/774; 977/891
(58) Field of Classification Search ............ 438/257, 438/264, 403, 680, 962, 593, 594; 117/87, 117/88; 377/773; 977/773–777, 891; 257/E21.618, 257/E21.681, E21.68
See application file for complete search history.

(56) References Cited

U.S. PATENT DOCUMENTS

| | | | | |
|---|---|---|---|---|
| 6,048,616 | A * | 4/2000 | Gallagher et al. | 428/407 |
| 6,297,095 | B1 | 10/2001 | Muralidhar et al. | |
| 6,322,901 | B1 * | 11/2001 | Bawendi et al. | 428/548 |
| 6,344,272 | B1 * | 2/2002 | Oldenburg et al. | 428/403 |
| 6,344,403 | B1 | 2/2002 | Madhukar et al. | |
| 6,660,381 | B2 * | 12/2003 | Halas et al. | 428/403 |
| 6,699,724 | B1 * | 3/2004 | West et al. | 436/525 |
| 6,783,569 | B2 * | 8/2004 | Cheon et al. | 75/348 |
| 6,784,103 | B1 | 8/2004 | Rao et al. | |
| 7,144,627 | B2 * | 12/2006 | Halas et al. | 428/403 |
| 7,306,823 | B2 * | 12/2007 | Sager et al. | 427/217 |
| 7,378,151 | B2 * | 5/2008 | Sato et al. | 428/403 |
| 7,399,429 | B2 * | 7/2008 | Liu et al. | 252/301.4 R |
| 7,402,832 | B2 * | 7/2008 | Lee | 257/17 |
| 7,405,002 | B2 * | 7/2008 | Ying et al. | 428/404 |
| 2003/0178571 | A1 * | 9/2003 | Nayfeh et al. | 250/372 |
| 2004/0208994 | A1 * | 10/2004 | Harkonen et al. | 427/249.1 |

(Continued)

FOREIGN PATENT DOCUMENTS

WO    WO-2006/091290 A2    8/2006

(Continued)

OTHER PUBLICATIONS

"International Application Serial No. PCT/US2007/080214, International Search Report mailed Nov. 17, 2008.", 2 pgs.

(Continued)

*Primary Examiner*—Matthew C Landau
*Assistant Examiner*—Joseph C Nicely
(74) *Attorney, Agent, or Firm*—Schwegman, Lundberg & Woessner, P.A.

(57) ABSTRACT

A technique to form metallic nanodots in a two-step process involving: (1) reacting a silicon-containing gas precursor (e.g., silane) to form silicon nuclei over a dielectric film layer; and (2) using a metal precursor to form metal nanodots where the metal nanodots use the silicon nuclei from step (1) as nucleation points. Thus, the original silicon nuclei are a core material for a later metallic encapsulation step. Metallic nanodots have applications in devices such as flash memory transistors.

19 Claims, 3 Drawing Sheets

U.S. PATENT DOCUMENTS

| | | | |
|---|---|---|---|
| 2005/0059213 A1* | 3/2005 | Steimle et al. | 438/260 |
| 2005/0074611 A1* | 4/2005 | Kuehnle et al. | 428/403 |
| 2005/0130324 A1* | 6/2005 | West et al. | 436/523 |
| 2006/0046384 A1 | 3/2006 | Joo et al. | |
| 2006/0194438 A1 | 8/2006 | Rao et al. | |
| 2006/0216606 A1* | 9/2006 | Kim et al. | 429/232 |
| 2006/0240258 A1* | 10/2006 | Sato et al. | 428/403 |
| 2006/0273376 A1* | 12/2006 | Weimer et al. | 257/321 |
| 2007/0085130 A1* | 4/2007 | Wang | 257/314 |
| 2007/0105312 A1* | 5/2007 | Min | 438/257 |
| 2007/0128796 A1* | 6/2007 | Chu | 438/257 |
| 2007/0207563 A1* | 9/2007 | Lin et al. | 438/57 |
| 2008/0050828 A1* | 2/2008 | Klimov et al. | 436/56 |
| 2008/0087314 A1* | 4/2008 | Xiao et al. | 136/201 |
| 2008/0095852 A1* | 4/2008 | Kong et al. | 424/489 |
| 2008/0138514 A1* | 6/2008 | Jang et al. | 427/213.3 |
| 2008/0207581 A1* | 8/2008 | Whiteford et al. | 514/183 |
| 2008/0230764 A1* | 9/2008 | Burt | 257/12 |
| 2009/0056628 A1* | 3/2009 | Kortshagen et al. | 118/718 |

FOREIGN PATENT DOCUMENTS

| | | |
|---|---|---|
| WO | WO-2006/112793 A1 | 10/2006 |
| WO | WO-2008/115266 A2 | 9/2008 |

OTHER PUBLICATIONS

"International Application Serial No. PCT/US2007/080214, Written Opinion mailed Nov. 17, 2008", 4 pgs.

* cited by examiner

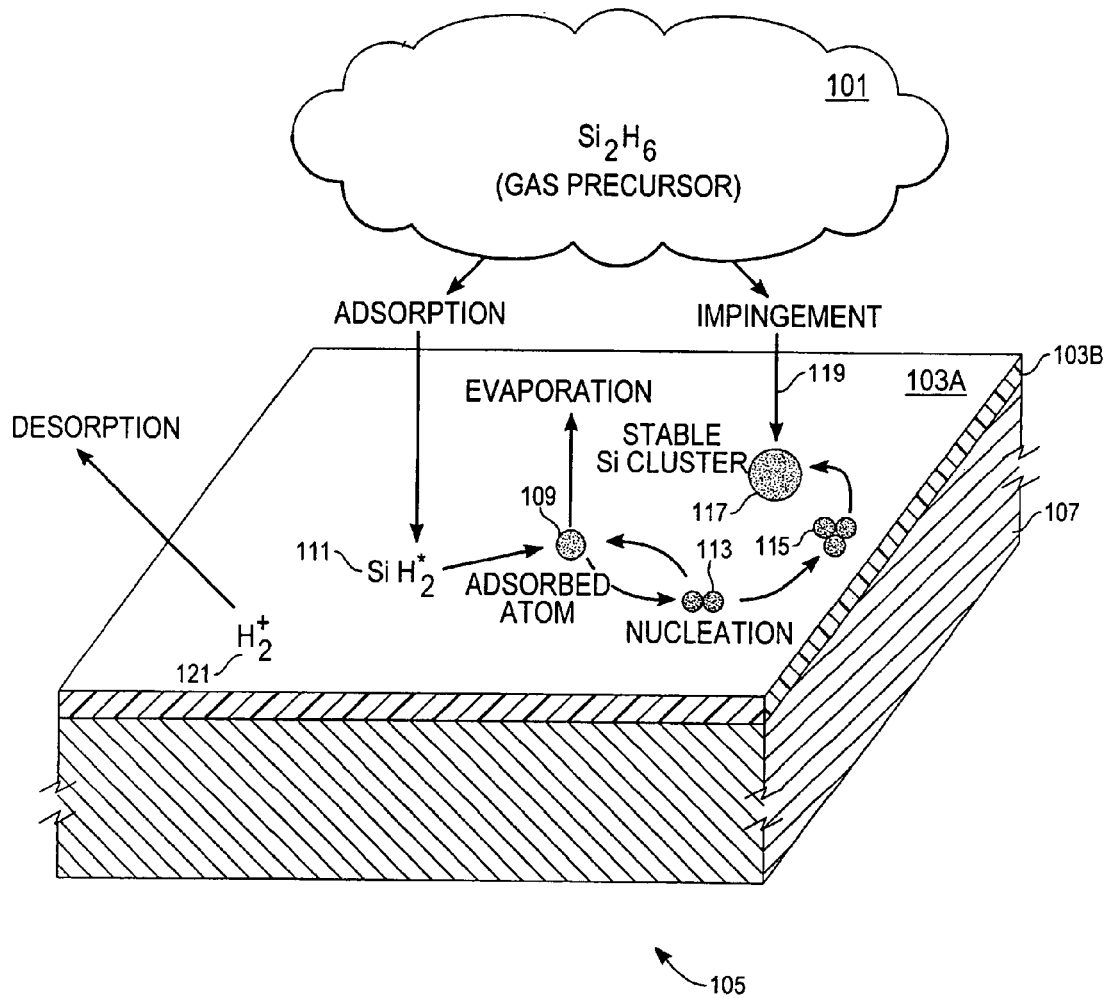
Fig. _ 1

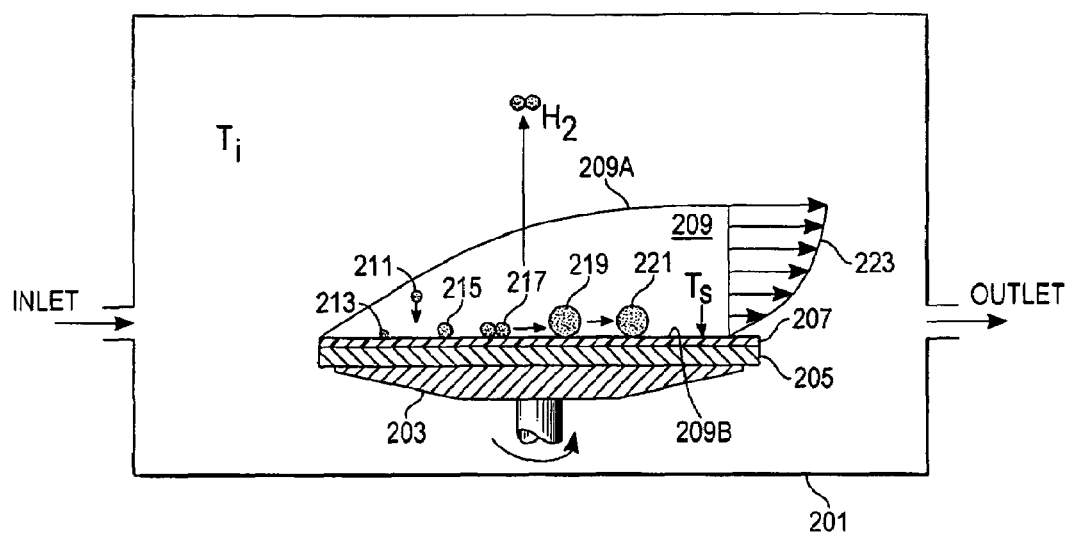
*Fig._2*
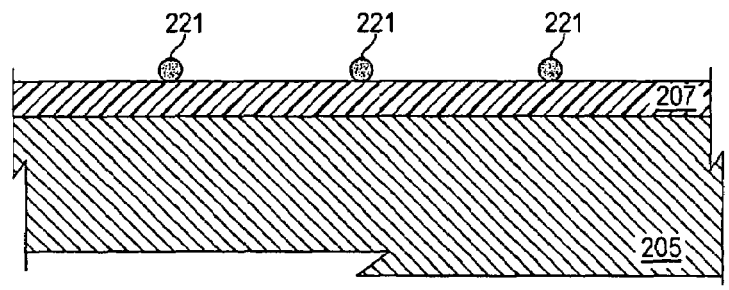
*Fig._3A*
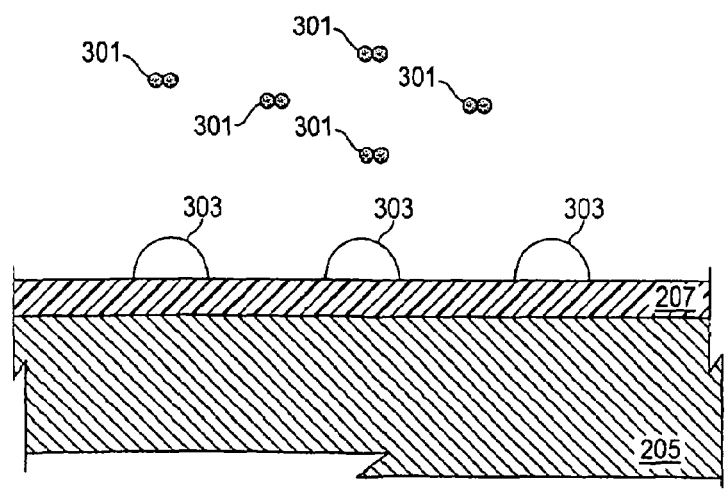
*Fig._3B*

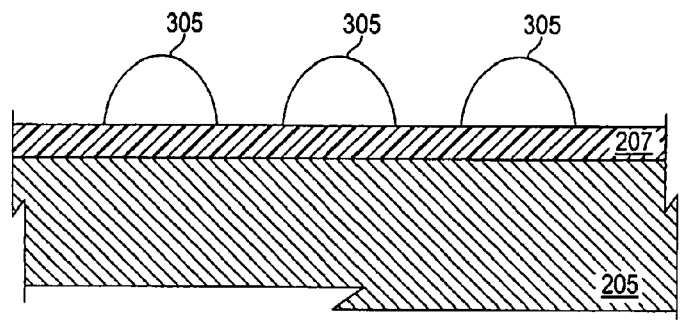
*Fig._3C*
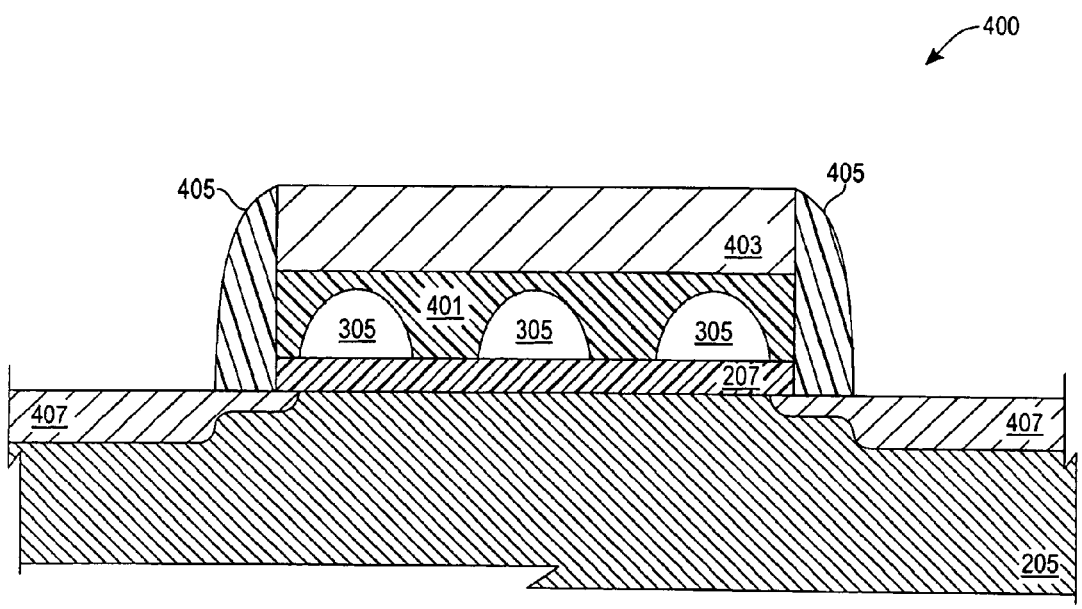
*Fig._4*

GROWTH OF SILICON NANODOTS HAVING A METALLIC COATING USING GASEOUS PRECURSORS

TECHNICAL FIELD

The invention relates generally to semiconductor devices and more particularly to a fabrication process for generating metallic nanostructures above a dielectric material.

BACKGROUND ART

Electrically erasable programmable read only memory (EEPROM) structures are commonly used in integrated circuits for non-volatile data storage. As is known, EEPROM device structures commonly include a floating gate that has charge storage capabilities. Charge can be forced into the floating gate structure or removed from the floating gate structure using control voltages. The conductivity of the channel underlying the floating gate is significantly altered by the presence of charges stored in the floating gate. The difference in conductivity due to a charged or uncharged floating gate can be current sensed, thus allowing binary memory states to be determined. The conductivity difference is also represented by shift in the threshold voltage ($V_t$) associated with the device in the two different states.

As semiconductor devices continue to evolve, the operating voltages of such semiconductor devices are often reduced in order to suit low power applications. It is desirable for such operating voltage reductions to be accomplished while ensuring that the speed and functionality of the devices is maintained or improved. A controlling factor in the operating voltages required to program and erase devices that include floating gates is the thickness of the tunnel oxide through which carriers are exchanged between the floating gate and the underlying channel region.

In many prior art device structures, the floating gate is formed from a uniform layer of conducting or semiconducting material such as polysilicon. In such prior art device structures, a thin tunnel dielectric layer beneath the floating gate presents the problem of charge leakage from the floating gate to the underlying channel through defects in the thin tunnel dielectric layer. Such charge leakage can lead to degradation of the memory state stored within the device and is therefore undesirable. In order to avoid such charge leakage, the thickness of tunnel dielectric is often increased. However, thicker tunnel dielectric requires higher (programming and erasing) voltages for storing and removing charge from the floating gate as the charge carriers must pass through the thicker tunnel dielectric. In many cases, higher programming voltages require the implementation of charge pumps on integrated circuits in order to increase the supply voltage to meet programming voltage requirements. Such charge pumps consume a significant amount of die area for the integrated circuit and therefore reduce the memory array area efficiency and increase overall costs.

In order to reduce the required thickness of the tunnel dielectric and improve the area efficiency of the memory structures by reducing the need for charge pumps, the uniform layer of material used for the floating gate may be replaced with a plurality of nanoclusters, which operate as isolated charge storage elements. Such nanoclusters are also often referred to as nanocrystals, as they may be formed of silicon crystals. In combination, the plurality of nanoclusters provides adequate charge storage capacity while remaining physically isolated from each other such that any leakage occurring with respect to a single nanocluster via a local underlying defect does not cause charge to be drained from other nanoclusters. That is, by controlling average spacing between nanoclusters, it can be ensured that there is no lateral charge flow between nanoclusters in the floating gate. As such, thinner tunnel dielectrics can be used in these device structures. The effect of leakage occurring in such thin tunnel dielectric devices does not cause the loss of state information that occurs in devices that include a uniform-layer floating gate.

A limiting factor in fabrication of devices that include floating gates made up of a plurality of nanoclusters relates to controlling size, density, and uniformity of the nanoclusters within the floating gate structure. The density of the nanoclusters is important in the determination of the change in the threshold voltage for the device between the states where the floating gate is charged or discharged. Higher densities are desirable as they lead to an increased change in threshold voltage when the density of charges per storage element is fixed. Prior art techniques for forming nanoclusters on the oxide tunnel dielectric were limited to a density as low as $5(10^{11})$ nanoclusters per $cm^2$. More recently, nanocluster densities of $1(10^{12})$ nanoclusters per $cm^2$ have been reported. With such a limited density of isolated storage elements, the charge density per nanocluster, or number of carriers that each nanocluster must retain, is forced to an elevated level. The higher storage density per nanocluster presents difficulties in storing (i.e., programming) a high number of electrons due to quantum confinement. In contrast to this limitation of higher nanocluster densities, lower nanocluster densities yields a smaller programming window at a given programming time. Furthermore, the programming time required for adding subsequent carriers continues to increase as the charge density per nanocluster is elevated. Even increasing the programming time may be insufficient to produce a proper number of carriers.

In one prior art technique for forming silicon nanoclusters, ion implantation is used to implant silicon atoms into a dielectric material. Following implantation, an annealing step causes these implanted silicon atoms to group together through phase separation to form the nanoclusters. Problems arise using such a technique due to the difficulty in controlling the depth at which the silicon nanoclusters are formed due to the phase segregation in the dielectric material. Since the depth at which the isolation storage elements are formed dramatically affects the electrical characteristics of the resulting device, ion implantation does not provide the level of control desired in a manufacturing situation.

In another prior technique for forming the silicon nanoclusters, a thin layer of amorphous silicon is deposited on the tunnel dielectric material. A subsequent annealing step is used to recrystallize the amorphous silicon into the nanoclusters. In order to produce nanoclusters of a desired density and size, the layer of amorphous silicon should be deposited such that it is on the order of 7-10 angstroms in thickness. Deposition of such thin layers of amorphous silicon is hard to control and therefore impractical in a manufacturing process. In addition to such control issues, additional problems may arise due to preexisting crystalline zones within the amorphous silicon layer. Such preexisting crystallites serve as nucleation sites for crystal growth, which deleteriously interferes with the spontaneous crystal growth desired for formation of the nanoclusters.

In other prior techniques for forming nanoclusters, chemical vapor deposition (CVD) techniques such as low pressure chemical vapor deposition (LPCVD) are used to nucleate and grow the nanoclusters directly on the tunnel oxide. Such prior art LPCVD techniques typically involve a very short deposition time period, on the order of approximately 10 to 30 seconds. Part of this deposition time period includes an incubation period where an adequate number of silicon atoms are generated on the surface of the dielectric prior to the commencement of the clustering activity that forms the crystalline structures of the nanoclusters. The remaining portion of the time is used to nucleate and grow the nanoclusters to the desired size. Due to the fact that the time period associated with nucleation and growth is so short, slight deviations in the processing parameters have profound effects on the resulting density and size uniformity of the resulting nanoclusters. Moreover, systematic effects can be significant. For example, portions of a silicon wafer being processed that are near the source of the reactant gas may realize a much higher density and size of nanoclusters, whereas portions of the wafers that are more distant from the reactant gas source would see lower densities and smaller sizes of nanoclusters. Such process non-uniformities are undesirable in manufacturing processes.

Prior art techniques exist only to grow semiconductor nanoclusters or nanocrystals. There is no known method to grow metallic nanodots around semiconductor nucleation points (i.e., the nuclei). Existing methods known to exist are merely based on metallic physical vapor deposition (PVD) coatings such as a de-wetting phenomena which occurs during an anneal step or, alternatively, a single-step metallic CVD deposition. However, neither of these techniques allow control of nanocluster density nor nanocluster size.

Advantages of metallic nanodots, as compared with semiconductor nanocrystals, include an ability to store more electrons (e.g., in a flash memory application) since little or no quantum confinement will occur. Therefore, a need exists for a method for including metallic nanoclusters within semiconductor devices in a manner that provides a high density of storage elements while maintaining control over the size dispersion of the storage elements.

SUMMARY

Generally, the present invention pertains to a semiconductor memory device with a floating gate that includes a plurality of metallic nanodots and techniques useful in the manufacturing of such a device. In order to prevent oxidation of the formed nanodots, the nanoclusters may be encapsulated or passivated prior to formation of a control dielectric layer. Such encapsulation may include forming a thin dielectric film layer, such as, for example, silicon nitride, on the nanodots. A gate electrode is then formed over the control dielectric and portions of the encapsulation dielectric. Portions of the plurality of nanodots and the encapsulation dielectric that do not underlie the gate electrode are selectively removed. Source and drain regions are formed by implantation or diffusing of dopants in the semiconductor layer such that a channel region is formed between the source and drain regions underlying the gate electrode.

In an exemplary embodiment, the present invention is a method of forming metallic nanodots. The method includes placing a substrate in a reactor chamber, elevating a temperature of the substrate, and reducing a pressure within the chamber. A dielectric film layer is formed on a surface of the substrate, and a plurality of silicon nucleation sites is formed on an exposed surface of the dielectric film layer. The silicon nucleation sites are formed by steps including (1) introducing a silicon-containing precursor gas into the reactor chamber, and (2) disassociating at least a portion of the silicon-containing precursor gas. Substantially each of the plurality of silicon nucleation sites is encapsulated with a metal coating where the metal coating is formed substantially around only the silicon nucleation sites. Metal encapsulation is performed by (1) introducing a metal-containing precursor gas into the reactor chamber, and (2) dissociating at least a portion of the metal-containing precursor gas.

In another exemplary embodiment, the present invention is a method of forming a flash memory transistor that includes placing a substrate in a reactor chamber, elevating a temperature of the substrate, and reducing a pressure within the chamber. A silicon dioxide film layer is formed on a surface of the substrate to a thickness selected to act as a tunneling layer. A plurality of silicon nucleation sites are formed on an exposed surface of the silicon dioxide film layer by (1) introducing a silicon-containing precursor gas into the reactor chamber, and (2) disassociating at least a portion of the silicon-containing precursor gas. Substantially each of the plurality of silicon nucleation sites is encapsulated with a metal coating, thus forming a plurality of metallic nanodots. The metal coating is selectively formed substantially around only the silicon nucleation sites by (1) introducing a metal-containing precursor gas into the reactor chamber, and (2) dissociating at least a portion of the metal-containing precursor gas. A dielectric layer is formed over the plurality of metallic nanodots and a gate electrode is formed over the dielectric layer.

In another exemplary embodiment, the present invention is a flash memory device. The flash memory device includes a substrate, a tunneling dielectric film layer formed over the substrate, and a plurality of metallic nanodots formed over the tunneling dielectric layer. The plurality of metallic nanodots is comprised of a metallic coating formed over a silicon nucleation site. A control dielectric film layer is formed over the plurality of metallic nanodots and a gate electrode formed over the control dielectric film layer.

BRIEF DESCRIPTION OF THE DRAWINGS

FIG. 1 is a graphical depiction of formation of core stable silicon clusters.

FIG. 2 is a graphical depiction of growth of core silicon clusters within a chemical deposition tool.

FIGS. 3A-3C indicate a metallic growth deposited on the stable silicon clusters produced in FIG. 2 producing metallic nanodots.

FIG. 4 is a cross-sectional diagram of an exemplary application of metallic nanodots of FIG. 3C used in forming a flash memory device.

DETAILED DESCRIPTION

A basic thin-film deposition process such as one occurring, for example, in a CVD tool, typically involves a number of sequential steps. Atoms and/or molecules produced within a CVD chamber adsorb onto a surface of a substrate. After adsorption, the atoms and/or molecules will frequently diffuse for some distance prior to becoming incorporated into any dielectric film layer present on the surface of a substrate. Incorporation involves a reaction or aggregation of the adsorbed species with each other and with the surface to form bonds between the adsorbed species and the dielectric film layer material. Aggregation of the adsorbed species is referred to as nucleation.

With reference to FIG. 1, an exemplary embodiment of atomic processes illustrates initial formation stages of nanodot formation. A precursor molecule, such as, for example, silane ($SiH_4$) or disilane ($Si_2H_6$), form a precursor 101 on a surface 103A of a dielectric film layer 103B of a semiconductor device 105. The dielectric film layer 103B may be, for example, a silicon dioxide film either thermally grown or deposited over a substrate 107. If the dielectric film layer 103B is a thermally grown silicon dioxide layer, the substrate 107 may be a silicon wafer. Moreover, using silicon dioxide for the dielectric film layer 103B may be useful in constructing a flash memory device. The flash memory device will described in detail with reference to FIGS. 3A-3D infra.

The precursor molecule, in this case disilane, can directly adsorb on the surface of silicon dioxide and form a silicon adsorbed atom 109 on the dielectric film layer surface 103A. This entire process may take place in a typical semiconductor fabrication tool, such as, for example, either a low-pressure CVD (LPCVD) or ultra-high vacuum CVD (UHCVD) deposition tool having a cold wall reactor chamber. Specifics of the chamber are described in detail infra.

A reactivity factor, referred to as a sticking coefficient, is a probability of molecules arriving at the surface of a dielectric film layer becoming incorporated into the film. Sticking coefficients can vary from unity to less than $1(10^{-3})$. The sticking coefficient of disilane, as used in this exemplary embodiment, is very small (much less than one) and consequently most of the disilane precursor leaves the reactor in an unreacted state. In the process illustrated in the exemplary embodiment of FIG. 1, the precursor 101 is heated locally near the dielectric film layer 103B thus forming an active radical silylene. The active silylene radical has a sticking coefficient close to unity and is adsorbed on the surface 103A of the dielectric film layer 103B. The active radical silylene readily decomposes to form a silicon adsorbed atom 109. A plurality of silicon adsorbed atoms 109 on the surface 103A of the dielectric film layer 103B diffuse on the surface 103A. Clusters of silicon adsorbed atoms 113 of varying sizes form due to random encounters of the plurality of silicon atoms 109. The clusters of silicon adsorbed atoms may also dissociate (not shown). Clustering continues until a larger cluster 115 of a size greater than a critical size is formed. The critical size is on the order of a few atoms. A stable cluster 117 can grow by diffusion of the surface adsorbed atoms 109 or other clusters 113, 115 adhering to each other. The stable cluster 117 may also grow by direct impingement of the active radical or precursor. The stable cluster 117 will act as a nucleation site for later deposition steps which will form a metallic layer around the stable cluster 117.

Desorption of a reaction byproduct, diatomic hydrogen ($H_2$), is a necessary and regular occurrence that exposes areas of the dielectric film layer surface 103A for adsorbed atom 109 formation. As indicated, adsorbed atom 109 can undergo a process of evaporation 123. Evaporation 123 is undesirable as it depletes the surface of adsorbed atoms 109 available for nucleation. As can be inferred from the foregoing description, formation of nanodot nucleation sites by atomistic nucleation is a complex process but can be controlled with careful attention to process conditions. An exemplary implementation of the process just described is presented in FIG. 2.

A cross-section of a cold wall LPCVD chamber 201 of FIG. 2 includes a substrate heating element 203, an inlet, and an outlet. A substrate 205 mounted within the chamber 201 has a dielectric film layer 207 formed on an uppermost surface of the substrate 205. The substrate heating element 203 rotates the substrate 205 and dielectric film layer 207 within the chamber 201 about a central vertical axis. As discussed with reference to FIG. 1, a formation rate of adsorbed atoms as well as the surface diffusion and atomic evaporation may be manipulated in various ways within the chamber 201 in order to increase a surface density of resulting nanodots.

When a precursor gas containing precursor molecules 211 is flowing within the chamber 201, a hydrodynamic and thermal boundary layer 209 is established over the dielectric film layer 207 and substrate 205. An interior temperature of the chamber 201 is generally at a temperature $T_i$. The substrate heating element 203 may be adjusted to maintain a temperature of the substrate, $T_s$, such that $T_s > T_i$. The boundary layer 209 assists in achieving a desired formation rate of adsorbed atoms.

In a specific exemplary embodiment, a total pressure within the chamber 201 is approximately in the range of 10 to 70 Torr, although ranges of pressure from 1 to 300 Torr or more may be used. Walls of the chamber 201 are cooled to a temperature much lower than a temperature of the substrate 205. The substrate 205 is heated and maintained at a relatively-fixed temperature by the substrate heating element 203. In this embodiment, the surface temperature of the substrate 205 is in a range of approximately 400° C. to 1000° C. The substrate heating element 203 may be implemented as a light heat source, a radiant heat source, or by other heating elements such as resistive heating elements.

The boundary layer 209 is in a gaseous state. An upper 209A and lower boundary 209B of the boundary layer 209 have temperatures nearly equal to the temperature, $T_s$, of substrate 205 at the lower boundary 209B and close to the inlet temperature, $T_i$, at the upper boundary 209A. A precursor, such as disilane gas, along with a large excess of an inert carrier gas, such as hydrogen ($H_2$) enter the chamber 201 at the inlet and are the precursor and carrier gases are mixed.

In a specific exemplary embodiment, a partial pressure of the precursor gas is chosen to be in a range of approximately 10 mTorr to 1000 mTorr for silicon nucleation site formation from either silane or disilane. The inlet temperature of the gases typically approximates ambient temperature. The boundary layer 209 forms in the presence of any flowing gas within the chamber 201 under conditions where the Knudsen number is less than 0.1. The Knudsen number (kn) is a dimensionless number defined as the ratio of a molecular mean free path length to a representative physical length scale. The Knudsen number is defined mathematically as:

$$Kn = \frac{\lambda}{L} = \frac{k_B T}{\sqrt{2\pi}\, \sigma^2 P L}$$

where $\lambda$ is the mean free path (nm), L is a physical length scale (nm), $k_B$ is Boltzmann's constant ($1.38(10^{-23})$ Joules/° K), T is the temperature of the gas (° K), $\sigma$ is a diameter of the gas molecule under consideration (nm), and P is the total pressure (Pa).

Precursor molecules 211, for example, are heated as they transport across the boundary layer 209 to the upper surface of the dielectric film layer 207. Heating the precursor molecules 211 causes a partial or complete dissociation of the precursor gas. For example, a gas phase decomposition reaction as will be described infra is known to occur.

Consequently, the surface of the dielectric film layer 207 is exposed to a mixture of disilane 213, silane 215, and silylene 217. The silylene 217 is a very active species and readily adsorbs on the surface of the dielectric film layer 207 while disilane and silane have substantially lower sticking coefficients and reaction rates on the surface. The adsorbed surface molecules (disilane, silane, and silylene) then decompose at the substrate temperature to form a silicon adsorbed atom 219. Diatomic hydrogen, $H_2$, is desorbed as a byproduct and removed from the boundary layer 209. Silicon atoms 219 nucleate forming stable silicon clusters 221.

FIG. 2 further shows a gas flow velocity profile 223 formed within the boundary layer 209. At the lower boundary 209B (coincident with the top surface of the dielectric film layer 207), a hydrodynamic no-slip condition of gas flow velocity implies a zero-velocity condition while a gas flow velocity at the upper boundary 209A is approximately equal to a mean velocity in the chamber 201.

With reference to FIG. 3A, the deposition process described in FIGS. 1 and 2 is completed. A plurality of stable silicon clusters 221 are formed on the dielectric film layer 207. In a specific exemplary embodiment, the substrate 205 is a silicon wafer substrate 205. The dielectric film layer 207 is a silicon dioxide layer which acts as a tunnel oxide for a flash memory device, described infra.

In FIG. 3B, similar deposition techniques described with reference to FIGS. 1 and 2 are applied to a metal precursor. Metal precursor molecules 301 interact exclusively with the plurality of stable silicon clusters 221 (FIG. 3A) to form a plurality of small metallic nanodots 303. A core of each of the plurality of nanodots 221 is thus the stable silicon clusters 221 (not shown in FIG. 3B). The metal precursor molecules only deposit around the core material of the stable silicon clusters 221. Thus, due to the nature of chemical interactions between the metal precursor molecules 301, the stable silicon clusters 221, and the dielectric film layer 207, deposition does not occur on the dielectric film layer 207. Specific metal-containing gas precursors that may be used include titanium tetrachloride ($TiCl_4$) or tungsten hexafluoride ($WF_6$), each delivered as a mixture with a hydrogen carrier gas (e.g., $TiCl_4$-$H_2$ or $WF_6$-$H_2$). Using one of these precursor gases results in a metallic coating over the stable silicon clusters 221. The metallic coating is, for example, titanium silicide ($TiSi_2$) or tungsten (W). Other metallic precursors and resulting metals are known to one of skill in the art.

In another exemplary embodiment, $TiCl_4$ is mixed with $H_2$ and dichlorosilane ($SiH_2Cl_2$ or DCS). DCS is used to balance the selectivity of deposition on the nucleation site versus self-nucleation or forming a metallic layer on the blanket oxide. In a specific exemplary embodiment, the process is carried out in a reactor at a pressure of 1 to 100 Torr at a temperature of 650° C. to 1000° C., with a DCS and $TiCl_4$ partial pressure of 0.1 to 5 Torr each with an $H_2$ carrier gas. Additionally, germane ($GeH_4$) or hydrogen chloride (HCl) may be added to further enhance selectivity control.

In another exemplary embodiment employing selective tungsten growth, $WF_6$ is mixed with $H_2$ and $SiH_4$. Here, $SiH_4$ is used to balance the selectivity of deposition on the nucleation site versus self-nucleation or forming a metallic layer on the blanket oxide. In a specific exemplary embodiment, the process is carried out in a reactor at a pressure of 1 to 100 mTorr at a temperature of 300° C. to 700° C., with flow rates of 5 to 50 sccm for $WF_6$ and 2 to 10 sccm for $SiH_4$, with an argon (Ar) carrier gas. Additionally, a small $H_2$ flow may be added to further enhance selectivity control.

Overall, selectivity of processes described is enhanced if formation of Si core nanoclusters and metallic growth around the core nanoclusters occurs within the same reactor (e.g., within the same LPCVD reactor or within a common cluster tool such that all processes are performed without breaking vacuum or under an $N_2$ ambient), thus preventing any native oxide growth on the core nanoclusters.

Deposition of metal precursor molecules 301 continues until larger sizes of metallic nanodots 305 are formed (FIG. 3C). Gas flow rates, deposition times, and substrate temperatures are parameters which may be varied to achieve a particular target size range of the metallic nanodots 305.

In FIG. 4, the metallic nanodots 305 are used to form an exemplary flash memory device 400. The substrate 205 may be of various materials. For semiconductor applications, the substrate 205 may be silicon, germanium or silicon-on-insulator (SOI). However, other substrate materials may be used. For example, compound semiconductors (e.g., compounds of elements, especially elements from periodic table groups III-V and II-VI) may be readily employed as the substrate 205. The dielectric film layer 207 may be of various materials, such as silicon dioxide, silicon nitride, or silicon oxynitride. Further, the dielectric film layer 207 may be comprised of a multilayer dielectric or a high dielectric constant (high-k) material (high-k dielectric materials are known in the art and include films such as tantalum pentoxide ($Ta_2O_5$), zirconium oxide ($ZrO_2$), hafnium oxide ($HfO_2$), and lead-zirconate-titanate (PZT). However, other dielectric materials may be employed as well.

In a specific exemplary embodiment, the dielectric film layer 207 is silicon dioxide formed on an uppermost surface of a silicon substrate by thermal oxidation of silicon. The metallic nanodots are formed over the dielectric film layer 207 by methods described herein.

An additional dielectric film layer 401, for example, a deposited silicon nitride layer, is formed over the metallic nanodots 305. A control gate 403 is then deposited over the additional dielectric film layer 401. The control gate layer 403 may be a deposited polysilicon layer. Conventional photolithographic techniques are used to etch a remaining portion of the dielectric film layer 207, the additional dielectric film layer 401, and the control gate layer 403 to a final form as shown in FIG. 4. The deposition of the film layers (other than growth and deposition of the metallic nanodots 305) and the photolithographic techniques are known in the art.

Dielectric spacers 405 are formed by depositing a blanket dielectric film layer (not shown), patterning, and etching. The etching is typically performed using an reactive-ion etch (RIE) process, thus removing primarily those portions of the blanket dielectric film layer that are substantially parallel (i.e., horizontal portions) to an uppermost surface of the substrate 205. The RIE process thus leaves substantially intact vertical portions of the blanket dielectric film layer. Consequently, the resulting dielectric spacers 405 are self-aligned with a given feature. Further, the dielectric spacers 405 allow an etch or alignment step surrounding the given feature to be below a photolithographic limit of resolution since the etch or alignment is now based merely on a thickness of the blanket dielectric film layer and a step-height of a proximate structure. Since a size of the dielectric spacers 405 are dependent on the thickness of chosen film layers, spacers may be created as thin as approximately 30 Å or less.

A final dopant step provides source and drain dopant areas 407 for the exemplary flash memory device 400. As is known to a skilled artisan, the dopant areas 407 may be either implanted or diffused.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that various types of dielectric layers or stacks of dielectric layers may be employed as a base for forming nanodots. Further, various types of metallic precursor gases exist which may be implemented to form nanodots by employing techniques described herein. Such techniques may be implemented in a variety of process tools such as, for example, those tools used in atomic layer deposition (ALD), chemical vapor deposition (CVD), low-pressure CVD (LPCVD), plasma-enhanced CVD (PECVD), or plasma-assisted CVD (PACVD). The specification and drawings are, accordingly, to be regarded in an illustrative rather than a restrictive sense.

What is claimed is:

1. A method of forming metallic nanodots, the method comprising:
    forming a dielectric film layer on a surface of a substrate;
    forming a plurality of silicon nucleation sites on an exposed surface of the dielectric film layer, the plurality of silicon nucleation sites being formed by steps including:
        (i) introducing a silicon-containing precursor gas into the reactor chamber, and
        (ii) disassociating at least a portion of the silicon-containing precursor gas; and encapsulating the plurality of silicon nucleation sites with a metal coating, the metal coating being selectively formed substantially around only the silicon nucleation sites by steps including:
            (i) introducing a metal-containing precursor gas into the reactor chamber, and
            (ii) dissociating at least a portion of the metal-containing precursor gas.

2. The method of claim 1 wherein the silicon-containing precursor gas is selected to be silane.

3. The method of claim 1 wherein the silicon-containing precursor gas is selected to be disilane.

4. The method of claim 1 wherein the metal-containing precursor gas is selected to be titanium tetrachloride.

5. The method of claim 1 wherein the metal-containing precursor gas is selected to be tungsten hexafluoride.

6. The method of claim 1 wherein a temperature of the substrate is elevated to a range of about 400° C. to 1000° C.

7. The method of claim 1 wherein a pressure within the chamber is reduced to a range of about 1 Torr to 300 Torr.

8. The method of claim 1, further comprising selecting the dielectric film layer to be silicon dioxide.

9. A method of forming metallic nanodots, the method comprising:
    forming a silicon dioxide film layer on a surface of a silicon substrate to a thickness selected to act as a tunneling layer;
    forming a plurality of silicon nucleation sites on an exposed surface of the silicon dioxide film layer, the silicon nucleation sites being formed by steps including:
        (i) introducing a silicon-containing precursor gas into the reactor chamber, and
        (ii) disassociating at least a portion of the silicon-containing precursor gas; and encapsulating the plurality of silicon nucleation sites with a metal coating, the metal coating being selectively formed substantially around only the silicon nucleation sites by steps including:
            (i) introducing a metal-containing precursor gas into the reactor chamber, and
            (ii) dissociating at least a portion of the metal-containing precursor gas.

10. The method of claim 9 wherein the silicon-containing precursor gas is selected to be silane.

11. The method of claim 9 wherein the silicon-containing precursor gas is selected to be disilane.

12. The method of claim 9 wherein the metal-containing precursor gas is selected to be titanium tetrachloride.

13. The method of claim 9 wherein the metal-containing precursor gas is selected to be tungsten hexafluoride.

14. A method of forming a flash memory transistor, the method comprising:
    forming a silicon dioxide film layer on a surface of a substrate to a thickness selected to act as a tunneling layer;
    forming a plurality of silicon nucleation sites on an exposed surface of the silicon dioxide film layer, the silicon nucleation sites being formed by steps including:
        (i) introducing a silicon-containing precursor gas into the reactor chamber, and
        (ii) disassociating at least a portion of the silicon-containing precursor gas; encapsulating the plurality of silicon nucleation sites with a metal coating thus forming a plurality of metallic nanodots, the metal coating being selectively formed substantially around only the silicon nucleation sites by steps including:
            (i) introducing a metal-containing precursor gas into the reactor chamber, and
            (ii) dissociating at least a portion of the metal-containing precursor gas;
    forming a dielectric layer over the plurality of metallic nanodots; and
    forming a gate electrode over the dielectric layer.

15. The method of claim 14 wherein the silicon containing precursor gas is selected to be silane.

16. The method of claim 14 wherein the silicon containing precursor gas is selected to be disilane.

17. The method of claim 14 wherein the metal-containing precursor gas is selected to be titanium tetrachloride.

18. The method of claim 14 wherein the metal-containing precursor gas is selected to be tungsten hexafluoride.

19. The method of claim 14 wherein material selected for the gate electrode is polysilicon.

* * * * *